(12) United States Patent
Pratt

(10) Patent No.: US 8,779,605 B2
(45) Date of Patent: Jul. 15, 2014

(54) METHOD AND APPARATUS PROVIDING INTEGRATED CIRCUIT HAVING REDISTRIBUTION LAYER WITH RECESSED CONNECTORS

(75) Inventor: David Pratt, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 13/605,621

(22) Filed: Sep. 6, 2012

(65) Prior Publication Data

US 2012/0326330 A1    Dec. 27, 2012

Related U.S. Application Data

(62) Division of application No. 13/097,463, filed on Apr. 29, 2011, now Pat. No. 8,274,163, which is a division of application No. 12/879,465, filed on Sep. 10, 2010, now Pat. No. 7,951,709, which is a division of application No. 11/727,553, filed on Mar. 27, 2007, now Pat. No. 7,812,461.

(51) Int. Cl.
*H01L 23/48* (2006.01)
*H01L 23/52* (2006.01)
*H01L 29/40* (2006.01)

(52) U.S. Cl.
USPC .............................. 257/786; 257/621

(58) Field of Classification Search
USPC ......... 257/234, 532, 620, 621, 690, 698, 736, 257/738, 750, 774, 780, 786; 438/106, 108, 438/583, 597, 612, 613, 639, 666, 667
See application file for complete search history.

(56) References Cited

U.S. PATENT DOCUMENTS

| | | | |
|---|---|---|---|
| 6,043,133 A | 3/2000 | Jang et al. |
| 6,232,143 B1 | 5/2001 | Maddix et al. |
| 6,236,103 B1 | 5/2001 | Bernstein et al. |
| 6,329,222 B1 | 12/2001 | Corisis et al. |
| 6,452,270 B1 | 9/2002 | Huang |
| 6,472,239 B2 | 10/2002 | Hembree et al. |
| 6,563,221 B1 | 5/2003 | Bell et al. |
| 6,611,052 B2 | 8/2003 | Poo et al. |
| 6,903,443 B2 | 6/2005 | Farnworth et al. |
| 6,958,540 B2 | 10/2005 | Gambino et al. |
| 6,962,867 B2 | 11/2005 | Jackson et al. |
| 6,979,651 B1 | 12/2005 | Hellig et al. |
| 7,101,792 B2 | 9/2006 | Kirby et al. |
| 7,109,068 B2 | 9/2006 | Akram et al. |
| 7,300,857 B2 | 11/2007 | Akram et al. |
| 7,316,063 B2 | 1/2008 | Farnworth et al. |
| 7,354,798 B2 | 4/2008 | Pogge et al. |
| 7,402,515 B2 | 7/2008 | Arana et al. |
| 7,563,714 B2 | 7/2009 | Erturk et al. |
| 2002/0190371 A1 | 12/2002 | Mashino et al. |
| 2005/0104228 A1 | 5/2005 | Rigg et al. |
| 2005/0250292 A1 | 11/2005 | Baluswamy et al. |
| 2007/0048994 A1 | 3/2007 | Tuttle |
| 2007/0190692 A1 | 8/2007 | Erturk et al. |

*Primary Examiner* — Errol Fernandes
(74) *Attorney, Agent, or Firm* — Dickstein Shapiro LLP

(57) ABSTRACT

A method of making a semiconductor die includes forming a trench around a conductive stud extending from the first side to a second side of a substrate to expose a portion of the stud and then forming a conductive layer inside the trench and in electrical contact with the stud.

5 Claims, 8 Drawing Sheets

METHOD AND APPARATUS PROVIDING INTEGRATED CIRCUIT HAVING REDISTRIBUTION LAYER WITH RECESSED CONNECTORS

CROSS-REFERENCE TO RELATED APPLICATIONS

This application is a divisional of U.S. application Ser. No. 13/097,463, filed Apr. 29, 2011 now U.S. Pat. No. 8,274,163, which is a divisional of U.S. application Ser. No. 12/879,465, filed Sep. 10, 2010 now U.S. Pat. No. 7,951,709, which is a divisional of U.S. application Ser. No. 11/727,553, filed Mar. 27, 2007, now U.S. Pat. No. 7,812,461, the entire disclosures of which are hereby incorporated by reference.

FIELD OF THE INVENTION

Embodiments herein relate to the field of integrated circuits formed on a semiconductor die, and more specifically to a method of forming a layer of connectors for a semiconductor die.

BACKGROUND OF THE INVENTION

In order to function, integrated circuits of semiconductor dies must be in electrical communication with signal input and output connections as well as with power, ground, or bias connections, which are external to the integrated circuit. For example, power and ground, or other reference voltages must be supplied for operation of the integrated circuit. Additional connections used for input, output and timing signals may also be required. These connections are conventionally made through leads or other conductive elements connected to bond pads associated with a semiconductor die.

As electronic devices have become smaller and more sophisticated, the challenge of minimizing the space used by component electrical circuits and connections on a semiconductor die has continued to increase. One technique for reducing the amount of space occupied by electrical circuits and connections required by a semiconductor die is the use of through wafer interconnect (TWI) vias to be formed through the entire thickness of a semiconductor die between the active surface and backside thereof, allowing electrical connection by "via studs" through the semiconductor die. This allows the external electrical elements of a semiconductor die to be more compact and also allows a die to be stacked with other devices to reduce the footprint space required by the die.

Another technique for reducing the space required by a semiconductor die includes the use of a redistribution layer (RDL), which is an additional level of wiring to reposition bond pads providing inputs and outputs for the die. The redistribution layer may be used to reposition bond pads from the perimeter or along the centerline of a semiconductor die to alternative locations, which may be less crowded.

In a conventional method of forming a backside redistribution layer, a backside of a substrate is thinned to expose a conductive via stud and a first dielectric layer is formed over the backside of the substrate. A first photolithography step is used to remove the dielectric material from over the via stud. Next, a metal layer is formed on the first dielectric layer and in electrical contact with the via stud. The metal layer is then patterned using a second photolithography step and a wet etching step so as to form a bond pad in contact with a via stud, a bond pad located away from the via stud and a conductive trace electrically connecting the bond pads. A second dielectric layer is then formed over the bond pads, the trace, and the first dielectric layer. The second dielectric layer is then removed from over the bond pad located away from the via stud using a third photolithography step.

Because photolithography is substantially expensive, the large number of photolithography steps used in the conventional process to form a redistribution layer increases the overall cost of the manufacture. Furthermore, the use of a wet metal etch to etch the metal layer may lead to undercutting along with an undesirable curved metal profile. Accordingly, there is a need and desire for a better method of forming a redistribution layer.

DETAILED DESCRIPTION

In the following detailed description, reference is made to the accompanying drawings, which form a part hereof, and in which is shown by way of illustration specific embodiments described herein. These embodiments are described in sufficient detail to enable those skilled in the art to practice them, and it is to be understood that other embodiments may be utilized, and that structural, logical and electrical changes may be made.

As used herein, the term "substrate" is to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on other semiconductors including silicon-germanium, germanium, or gallium-arsenide. Although embodiments described herein refer to a "semiconductor die" it should be appreciated that the embodiments may be practiced upon a semiconductor wafer, which includes multiple semiconductor dies that may later be separated, or a partial wafer.

One embodiment described herein provides a method of creating a backside redistribution layer on a through wafer interconnect semiconductor die by way of etching a trench into the backside of a substrate to produce a trench arranged around a through wafer interconnect via stud and extending away from the stud. The trench may then be filled with a conductive metal to provide electrical contact to the through wafer interconnect via stud while at the same time forming the bond pads and conductive traces. Embodiments described herein reduce the number of photolithography steps and other steps required to form a redistribution layer.

Figure 1:
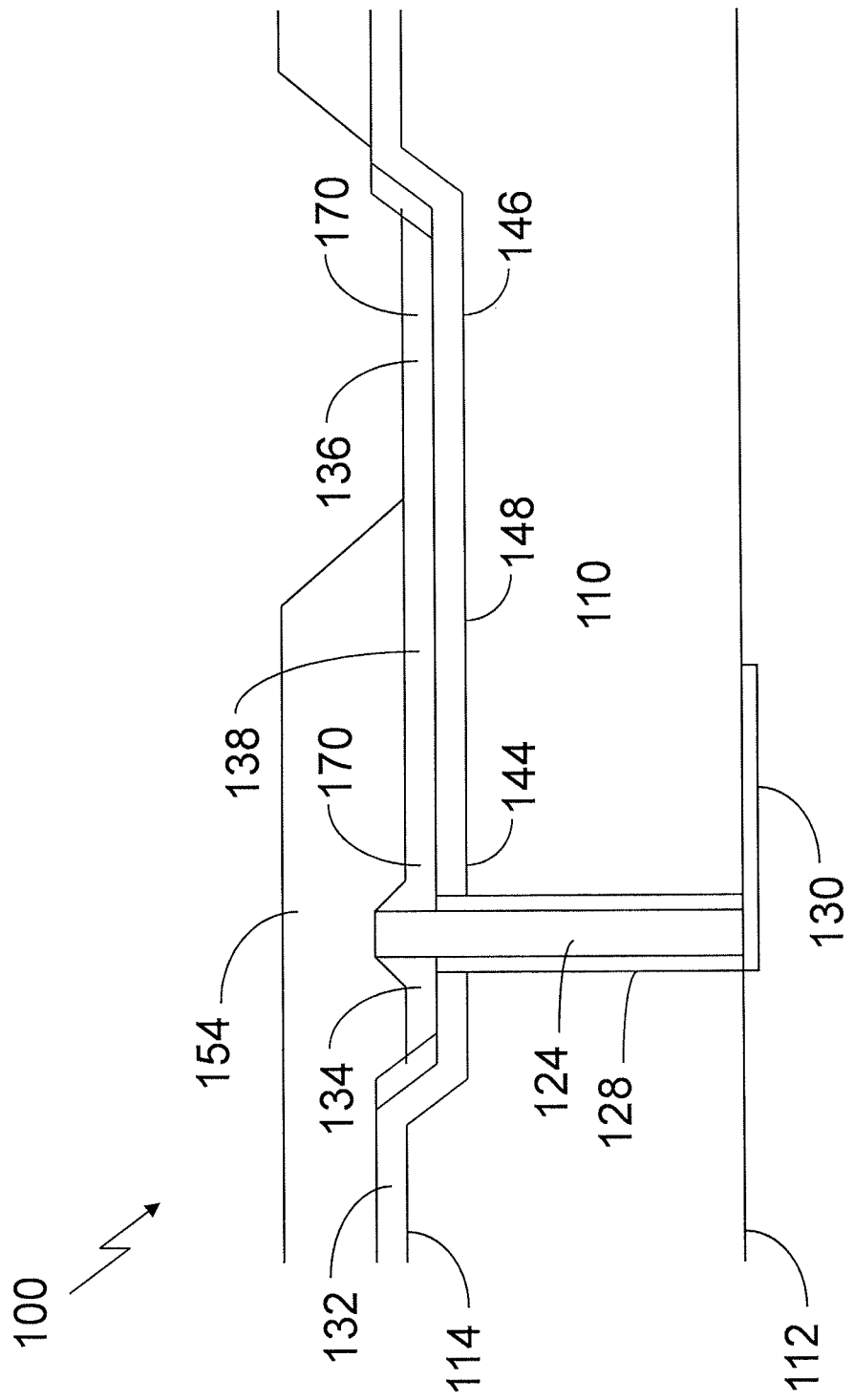
FIG. 1 is a partial side view of a semiconductor die in accordance with an embodiment described herein.
Figure 4:
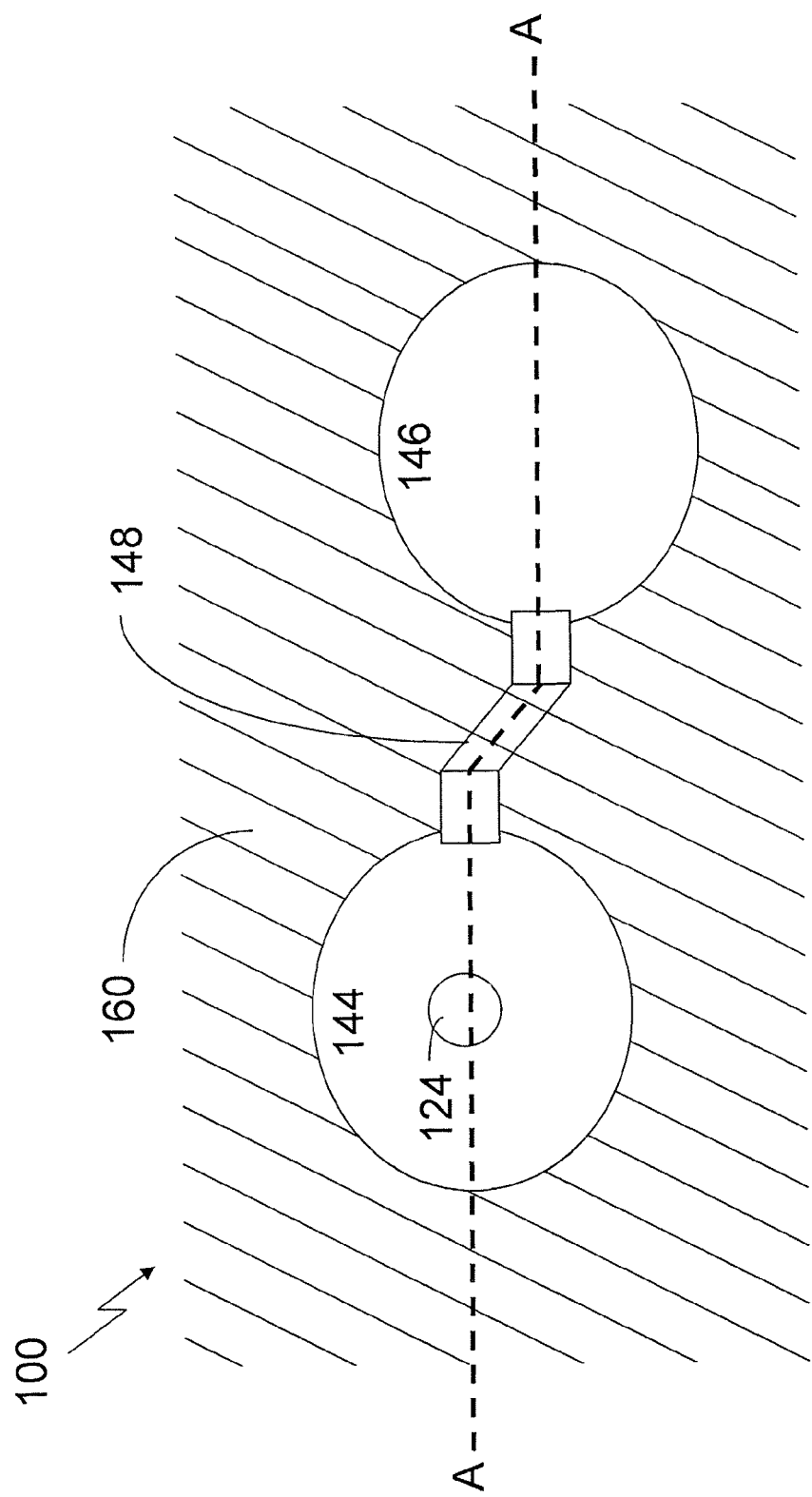
FIG. 4 shows a top view of the semiconductor die of FIG. 3.

FIG. 1 shows a partial side view of a semiconductor die 100 cut away along line AA as shown in FIG. 4 in accordance with an embodiment. The semiconductor die 100 includes a semiconductor substrate 110, which has an active surface 112 and a back surface or backside 114. The substrate 110 has integrated circuitry (not shown) formed in and on the active surface 112. The semiconductor substrate 110 includes a plurality of through wafer electrical interconnect conductive studs 124 extending through vias in the substrate 110 from the active surface 112 to the backside 114. The via studs 124 are arranged to be substantially perpendicular to the plane of the substrate 110. The via studs 124 may be formed in portions of the substrate 110 without integrated circuitry formed therein and redistribution lines 130 may be used to electrically connect the integrated circuitry to the studs 124. The studs 124 may be surrounded by one or more dielectric layers 128, such as silicon dioxide or other dielectric material, which insulates the conductive studs 124 from the substrate 110.

One embodiment, as shown in FIGS. 1 and 4, the backside 114 includes a trench having a first portion 144 surrounding the via stud 124, a second portion 146 that may be located closer to the periphery of the semiconductor die 100 than the first portion 144, and a third portion 148 between the first and second portions 144, 146. A first dielectric layer 132 is arranged on the backside and within the trench. A conductive redistribution layer 170 is arranged in the trench on the first dielectric layer 132 to form a first bond pad 134 in electrical contact with the via stud 124, a second bond pad 136, and a conductive trace 138 between bond pads 134, 136. The redistribution layer 170 may be made of a conductive metal, such as aluminum, copper, or an alloy of either. It should be appreciated that the trench and redistribution layer may be arranged in a variety of patterns depending on the design of the semiconductor die 100. A second dielectric layer 154 is arranged over the first dielectric layer 132 and the redistribution layer 170. The second dielectric layer 154 is etched away from or patterned open over the second portion 146 to expose the second bond pad 136 to allow exterior connections to the die 100. The second dielectric layer 154 may also optionally be etched away from or patterned open over the first portion 134 and via stud 124, exposing them as well to allow exterior connections.

Figure 2:
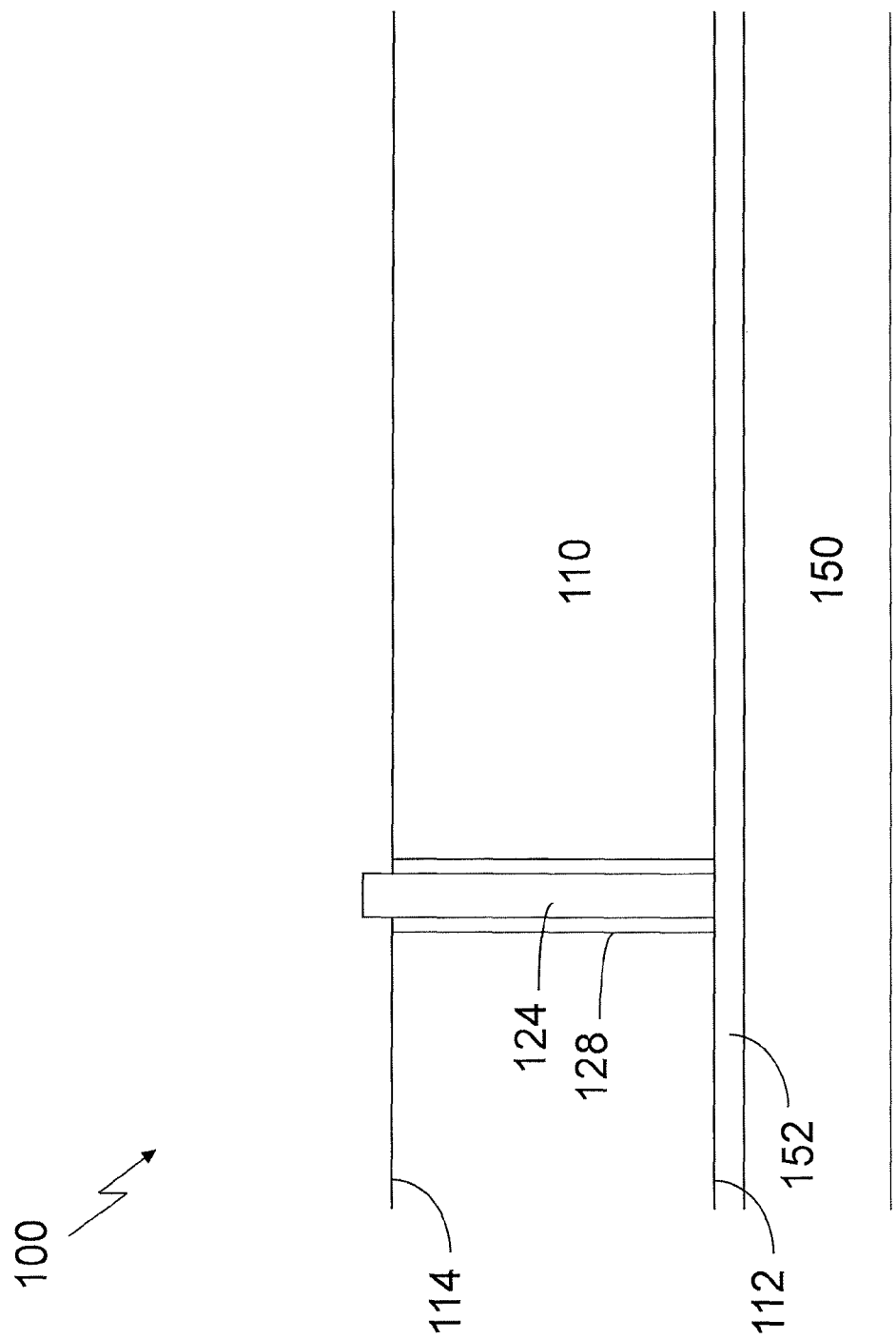
FIG. 2 is a partial side view of a semiconductor die at a stage of manufacture in accordance with an embodiment.

An example method of making a semiconductor die 100 in accordance with an embodiment is now described. FIG. 2 shows a step in which a substrate 110 of a semiconductor die 100 is thinned and optionally polished to expose through wafer interconnect via stud 124. The stud 124 may be thick copper with or without polymer filler, high temperature solder, or the like. The semiconductor die 100 may be attached to a temporary carrier 150 by an adhesive layer 152 with the polished backside 114 of the substrate exposed for processing. FIG. 2 shows a small portion of stud 124 protruding from the backside 114 surface. The polishing process may be optimized so that the backside 114 is selectively polished away from the stud 124. This allows the stud 124 to slightly protrude from the backside 114. Therefore, the stud 124 is exposed during the grinding process.

Figure 3:
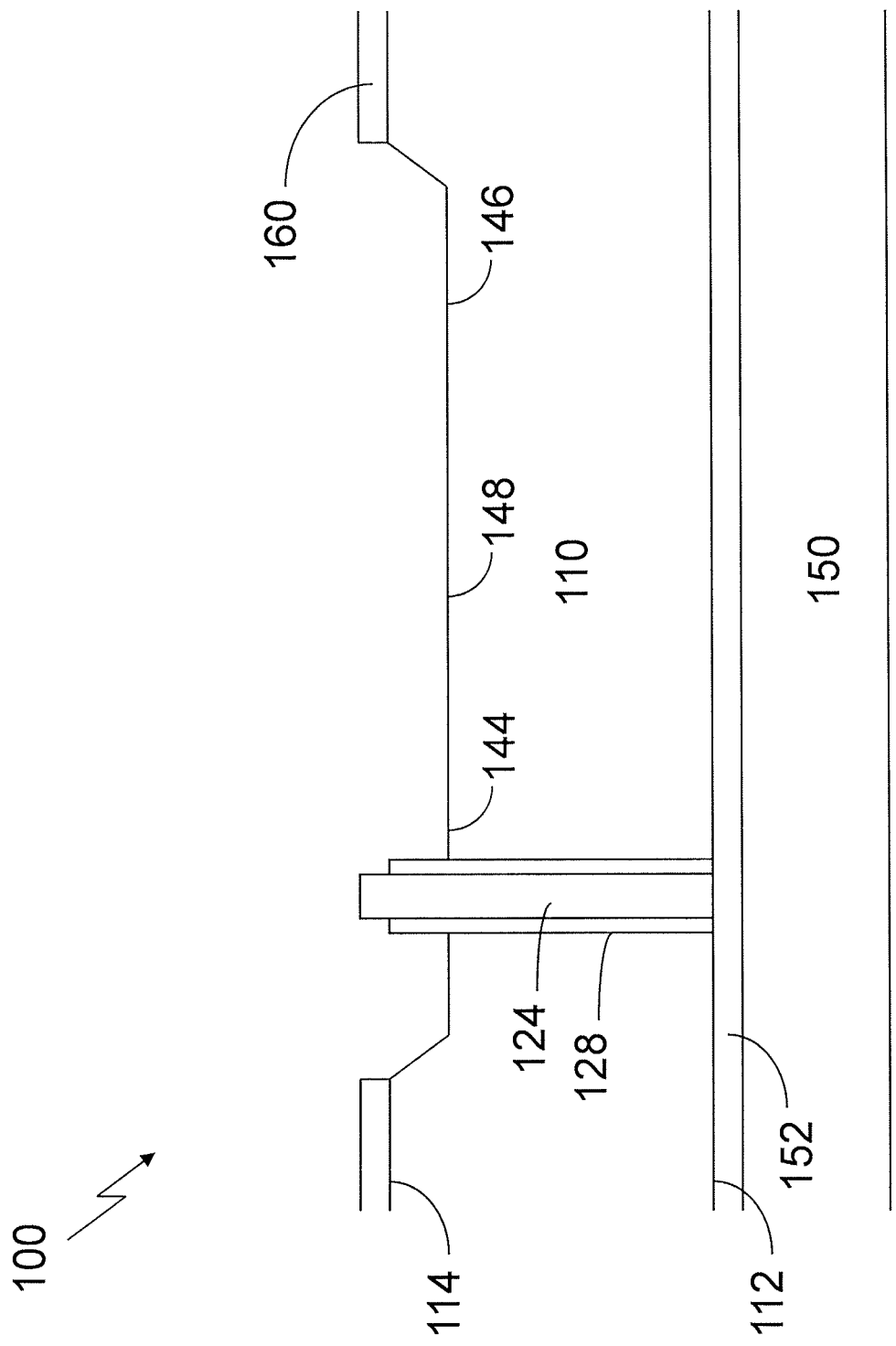
FIG. 3 is a partial side view of the semiconductor die of FIG. 2 at a stage of manufacture in accordance with an embodiment described herein.

Next, as shown in FIG. 3, a patterned resist mask 160 is applied to the backside 114 of the substrate 110 using photolithography techniques to create a resist pattern in which the locations for the first bond pad 134, the second bond pad 136, and the trace 138 are exposed for etching. A wet or dry etch process is performed to form the trench including the first portion 144, the second portion 146, and the third portion 148 in the substrate 110. A portion of the through wafer interconnect via stud 124 and surrounding dielectric layer 128 are thus exposed within the first portion 144. FIG. 4 shows a top view of the semiconductor die 100 of FIG. 3. The resist mask 160 is removed when the trench etching is complete.

Figure 5:
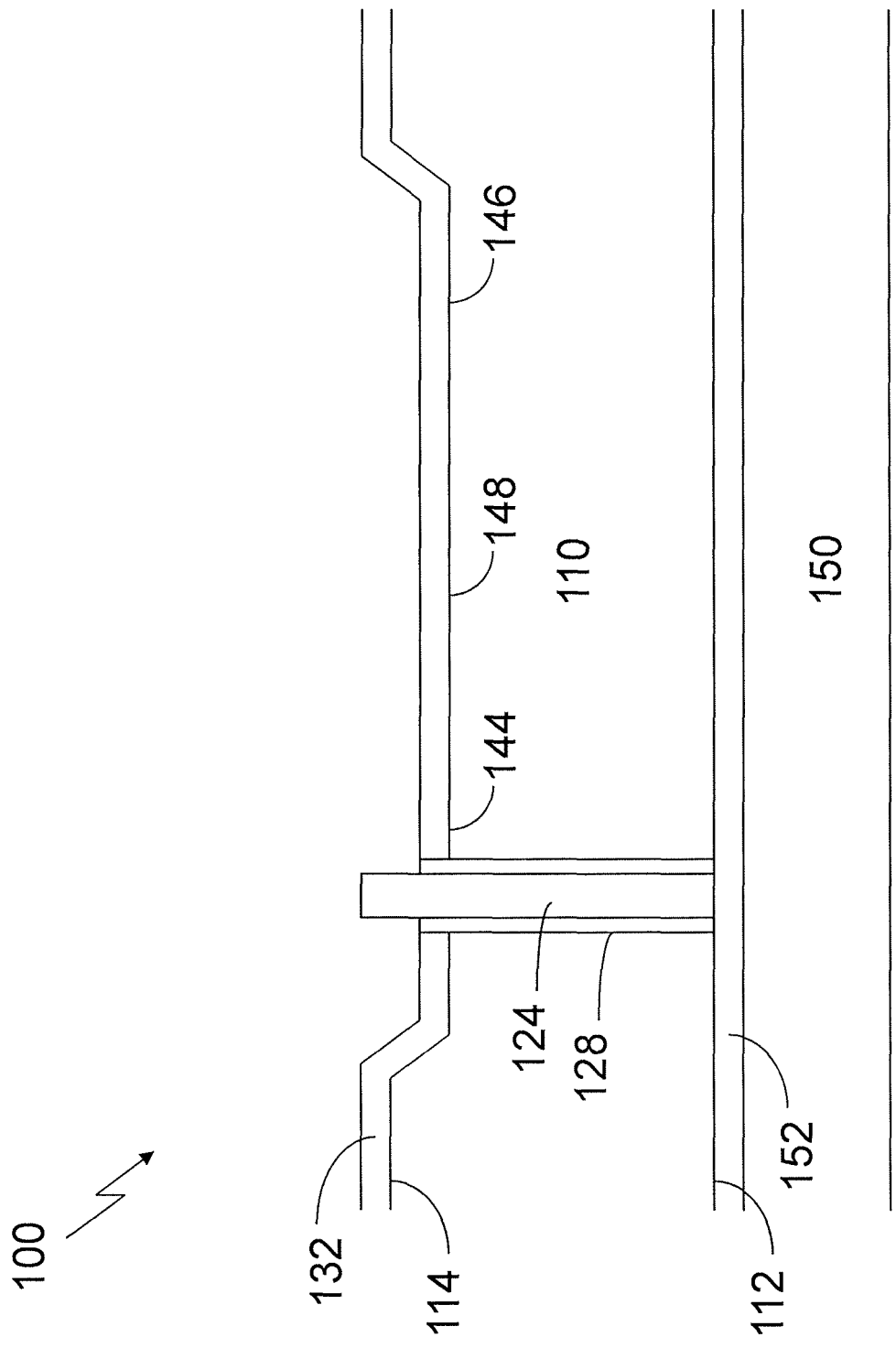
FIG. 5 is a partial side view of the semiconductor die of FIG. 3 at a stage of manufacture in accordance with an embodiment described herein.

The backside 114 of the substrate 110 is then coated with a dielectric material, such as a polyimide or other insulating material, to form the first dielectric layer 132, as shown in FIG. 5. The dielectric material is applied so that it is also arranged inside the trench and around the exposed via stud 124 and dielectric layer 128. In one embodiment, the dielectric material may be spun on or spray coated on to the substrate 110. The dielectric material in layer 132 is then cured to form the first dielectric layer 132. It should be noted that the dielectric layer 128 may be formed without the use of photolithography or exposing and developing the dielectric material. The substrate 110 may then be processed using a light hydrofluoric acid dip or similar oxide etch chemistry to etch away the one or more dielectric layers 128 from the exposed portion of the stud 124 to form a contact point for the metal trace 138 (FIG. 1). An $O_2$ descum or other suitable method may be used to ensure the top portion of the stud 124 is free of dielectric material from the first dielectric layer 132.

Figure 6:
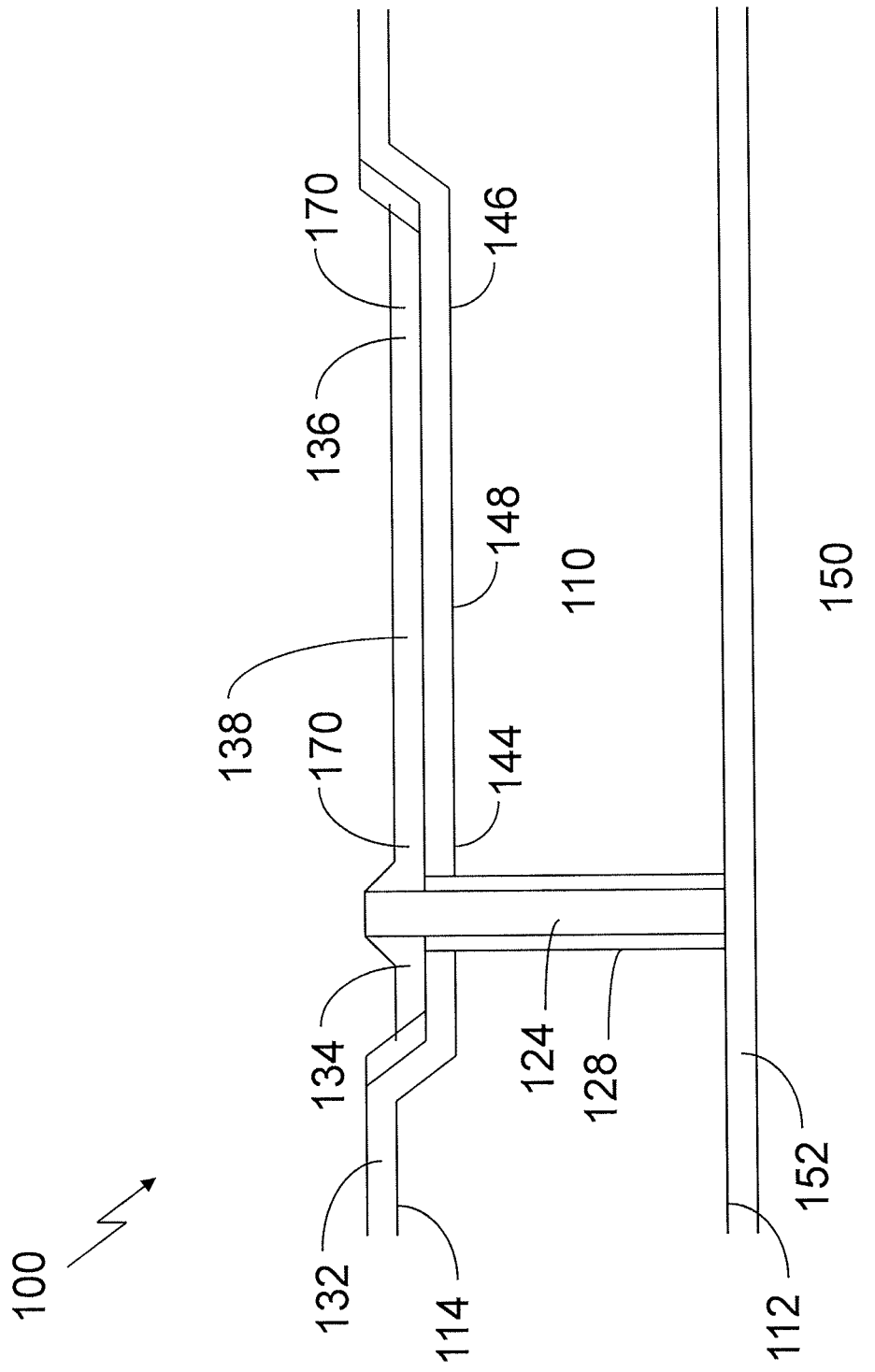
FIG. 6 is a partial side view of the semiconductor die of FIG. 5 at a stage of manufacture in accordance with an embodiment described herein.
Figure 7:
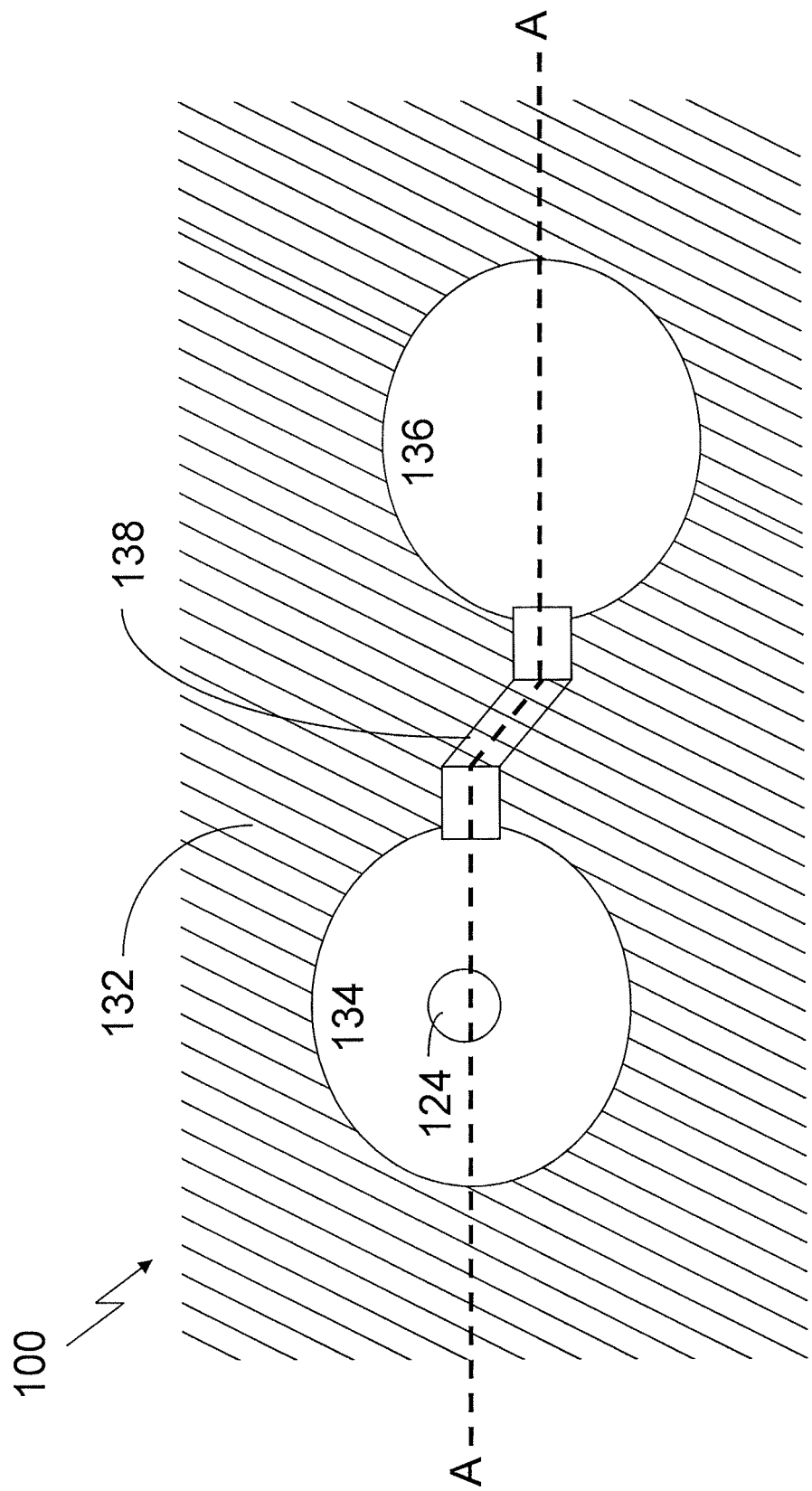
FIG. 7 shows a top view of the semiconductor die of FIG. 6.

Next, as shown in FIG. 6, a layer of conductive metal is deposited onto the backside 114 of the substrate 110 on top of the first dielectric layer 132 and the stud 124. The layer of conductive metal may be formed of conductive metals or metal stacks known in the art, such as aluminum, copper, or an alloy of either. The layer of conductive metal may be formed on the backside 114 using chemical vapor deposition (CVD), plasma enhanced CVD, also known as physical vapor deposition (PVD), sputtering, evaporation or other techniques known in the art. Chemical mechanical polishing (CMP) or grinding is used to remove the metal down to the underlying first dielectric layer 132 so that the metal only remains within the trench portions 144, 146, 148 and optionally over the top of the stud 124 to form the first bond pad 134, the second bond pad 136, and the trace 138, respectively, as shown in FIG. 6. The trench must be deep enough so that the metal within the trenches is not removed during the CMP or grind step. FIG. 7 shows a top view of the semiconductor die 100 of FIG. 6.

Figure 8:
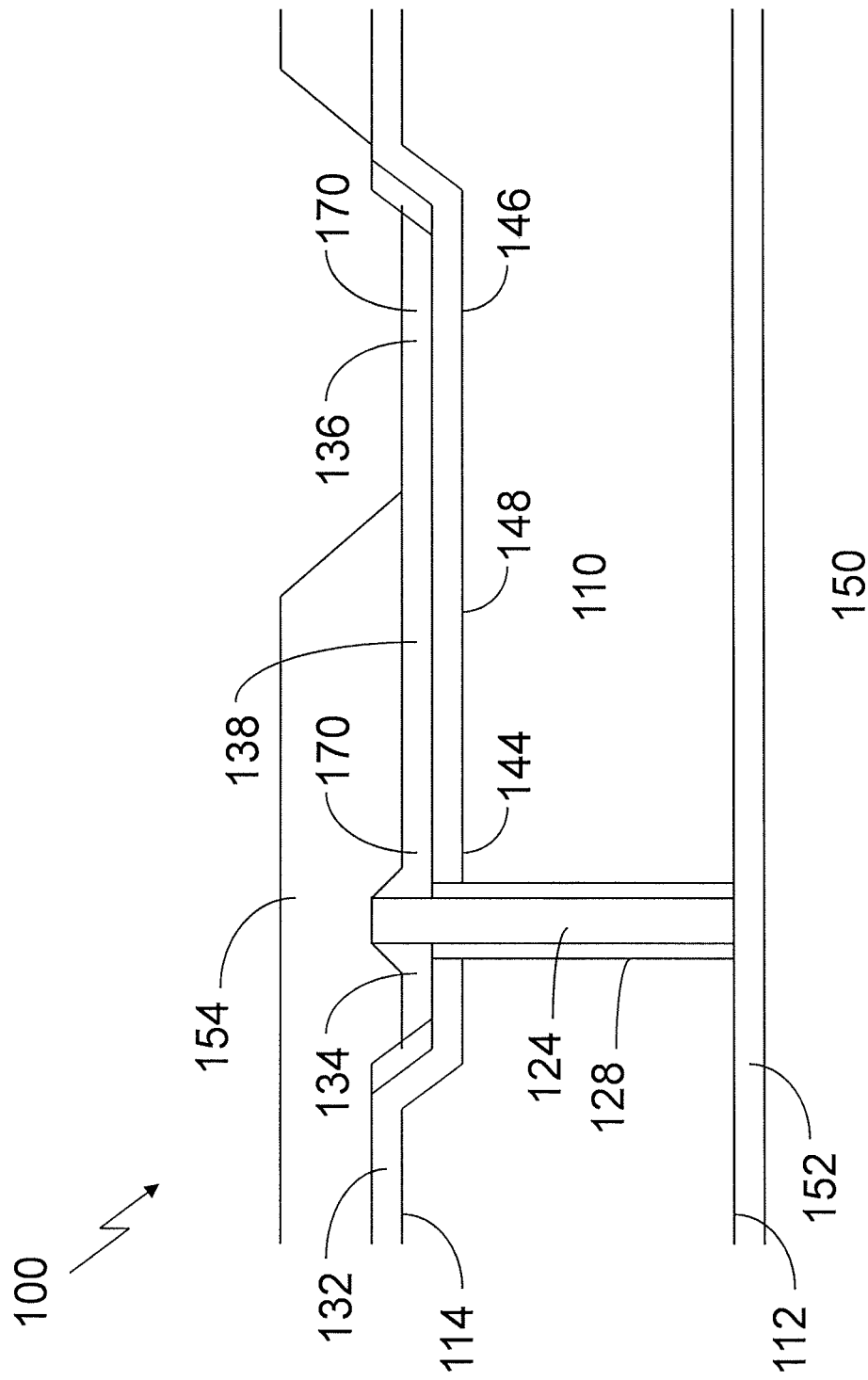
FIG. 8 is a partial side view of the semiconductor die of FIG. 6 at a stage of manufacture in accordance with an embodiment described herein.

Next, as shown in FIG. 8, a dielectric material, such as polyimide, PBO, or a photosensitive dielectric, is applied over the backside 114 of the substrate 110 and patterned to form a second dielectric layer 154. In one embodiment, the dielectric material may be spun on. The second dielectric layer 154 may be patterned using photolithography techniques to expose the second bond pad 136 for down stream solder ball or bump bonds. Optionally, the first bond pad 134 and the via stud 124 may also be exposed during the patterning of the second dielectric layer 154 or may remain covered by the second dielectric layer 154 as desired. Finally, the through wafer interconnect semiconductor die 100 may be released from the temporary carrier 150 to produce the semiconductor die 100 shown in FIG. 1.

The processes and devices described above illustrate preferred methods and typical devices of many that could be used and produced. The above description and drawings illustrate embodiments, which achieve the objects, features, and advantages described herein. However, it is not intended that the embodiments be strictly limited to the described and illustrated embodiments. For example, although embodiments have been described as being useful for producing a redistribution layer, it should be appreciated that embodiments could be used to produce a conductive layer of various shapes in various locations on a semiconductor die.

What is claimed as new and desired to be protected by Letters Patent of the United States is:

1. An electronic device comprising:
    a semiconductor die comprising:
    a substrate;
    integrated circuitry arranged in a first surface of the substrate;
    a trench arranged in a second surface of the substrate;
    a first dielectric layer arranged within the trench;
    a conductive redistribution layer wholly contained within the trench and on the first dielectric layer, the conductive redistribution layer being electrically coupled to the integrated circuitry; and
    a conductive stud electrically coupling the integrated circuitry to the conductive redistribution layer;
    wherein the conductive redistribution layer comprises a first bond pad, a second bond pad and a conductive trace electrically coupling the second bond pad to the first bond pad.

2. The semiconductor die of claim 1, wherein the first bond pad is in electrical contact with the conductive stud.

3. The semiconductor die of claim 1, wherein the conductive redistribution layer comprises at least one of aluminum, copper, an alloy of aluminum, and an alloy of copper.

4. The semiconductor die of claim 1, further comprising a second dielectric layer arranged over at least the first bond pad and the conductive trace.

5. The semiconductor die of claim 1, wherein the second bond pad is connected to the electronic device.

* * * * *